| United States Patent [19] | [11] Patent Number: 5,009,981 |
|---|---|
| Matsubara et al. | [45] Date of Patent: Apr. 23, 1991 |

[54] PHOTOSENSITIVE COMPOSITION

[75] Inventors: Shinichi Matsubara; Masafumi Uehara, both of Tokyo; Shinichi Bunya; Eriko Katahashi, both of Yokohama, all of Japan

[73] Assignees: Konica Corporation; Mitsubishi Kasei Corporation, both of Tokyo, Japan

[21] Appl. No.: 585,048

[22] Filed: Sep. 20, 1990

Related U.S. Application Data

[63] Continuation-in-part of Ser. No. 376,517, Jul. 7, 1989, abandoned.

[30] Foreign Application Priority Data

Jul. 11, 1988 [JP] Japan .................. 63-172240
Jul. 11, 1988 [JP] Japan .................. 63-172241
Jul. 11, 1988 [JP] Japan .................. 63-172242

[51] Int. Cl.$^5$ .............................. G03C 1/52
[52] U.S. Cl. .................... 430/175; 430/176; 430/177
[58] Field of Search ............ 430/175, 176, 177

[56] References Cited

U.S. PATENT DOCUMENTS

| 3,230,087 | 1/1966 | Sus et al. | 430/175 |
| 3,867,147 | 2/1975 | Teuscher | 430/176 |
| 4,247,615 | 1/1981 | McGuckin et al. | |
| 4,659,645 | 4/1987 | Frommeld et al. | 430/175 |
| 4,687,727 | 8/1987 | Toyama et al. | 430/175 |
| 4,701,399 | 10/1987 | Nagano et al. | 430/175 |

FOREIGN PATENT DOCUMENTS

| 3716607 | 11/1987 | Fed. Rep. of Germany . |
| 7422 | 2/1974 | Japan . |
| 58127923 | 7/1983 | Japan . |
| 58187925 | 11/1983 | Japan . |
| 2057704 | 4/1981 | United Kingdom . |

OTHER PUBLICATIONS

Kosar, J., "Light-Sensitive Systems", Wiley & Sons, 8/1965, pp. 322-324.

Primary Examiner—Charles L. Bowers, Jr.
Assistant Examiner—Christopher G. Young
Attorney, Agent, or Firm—Finnegan, Henderson, Farabow, Garrett & Dunner

[57] ABSTRACT

A photosensitive composition, comprising a photosensitive diazo compound and a polymeric binder, wherein the diazo compound has a polymerizable unsaturated bond in the molecule.

9 Claims, No Drawings

PHOTOSENSITIVE COMPOSITION

This application is a continuation-in-part of application Ser. No. 07/376,517, filed July 7, 1989, now abandoned.

BACKGROUND OF THE INVENTION

This invention relates to a photosensitive composition, particularly to a photosensitive composition suitable for preparation of nega-type photosensitive lithographic printing plate.

Photosensitive printing plates are generally obtained by coating a photosensitive composition on a support such as aluminum plate, etc., irradiating an active ray such as UV-ray through a negative image, etc. to polymerize or crosslink the portion irradiated with the light, thereby insolubilizing said portion in a developer, dissolving out the non-irradiated portion into a developer, thereby making the respective portions an image portion which repels water and receives an oily ink and a non-image portion which receives water and repels the oily ink.

As the photosensitive composition in this case, particularly in nega-type PS plates, there have been widely employed diazo resins such as condensates of p-diazodiphenylamine and formaldehyde.

On the other hand, Japanese Unexamined Patent Publication No. 115150/1977 discloses a technique for preventing polymerization inhibition with oxygen during image exposure by addition of a diazo resin in a photopolymerizable photosensitive composition.

However, the compositions according to the techniques of the prior art are not sufficient in sensitivity and chemical resistance. Besides, even by the technique in the above publication, the influence from oxygen could not be fully precluded.

Accordingly, a main object of the present invention is to provide a photosensitive composition, which is not only excellent in sensitivity and chemical resistance, but also can prevent surely polymerization inhibition with oxygen, and therefore is suitable particularly for nega-type photosensitive printing plate.

SUMMARY OF THE INVENTION

The above task can be solved by a photosensitive composition comprising a photosensitive diazo compound and a polymeric binder, wherein said diazo compound has a polymerizable unsaturated bond in the molecule.

In preferred embodiments, the photosensitive composition further contains a photopolymerization initiator and/or a photopolymerizable monomer therein, and said polymeric binder is an alkali soluble polymer or a polymer having a polymerizable unsaturated bond in the molecule.

DESCRIPTION OF THE PREFERRED EMBODIMENTS

The present invention is to be described below in more detail.

The Diazo Compound Having Polymerizable Unsaturated Bond In The Molecule

The diazo compound according to the present invention has the structure represented by the following formula (I):

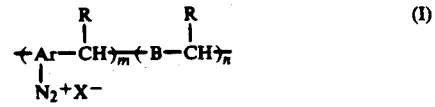

wherein $m = 1 \sim 20$ and $n = 1 \sim 20$.

Here, $ArN_2X$ is an aromatic having a diazonium salt. B an aromatic having polymerizable unsaturated bond and R hydrogen atom, methyl group or phenyl group.

As $ArN_2X$, those set forth in Japanese Patent Publication No. 48001/1974 can be used, particularly preferably diphenyl-4-diazonium salts. The diphenylamine-4-diazonium salts are derived from 4-aminodiphenylamines, and such 4-aminodiphenylamines may include 4-aminodiphenylamine, 4-amino-3-methoxy-diphenylamine, 4-amino-2-methoxy-diphenylamine, 4'-amino-2-methoxy-diphenylamine, 4'-amino-4-methoxy-diphenylamine, 4-amino-3-methyl-diphenylamine, 4-amino-3-ethoxy-diphenylamine, 4-amino-3-$\beta$-hydroxyethoxy-diphenylamine, 4-aminodiphenylamine-2-sulfonic acid, 4-amino-diphenylamine-2-carboxylic acid, 4-amino-diphenylamine-2'-carboxylic acid, and the like, particularly preferably 3-methoxy-4-amino-diphenylamine and 4-amino-diphenylamine.

On the other hand, as the aromatic having polymerizable unsaturated bond forming B in the formula (I), there can be included specifically hydroxyphenylacrylamide, 4-hydroxyphenyl-methacrylamide, phenyl-methacrylamide, phenylacrylamide, styrene, methylstyrene, benzyl acrylate, benzyl methacrylate, modified bisphenol A dimethacrylates, bisphenol type epoxy acrylate, nonylphenoxy polyethylene glycol acrylate, ECH modified phenoxyacrylate, phenoxyethyl acrylate, phenoxy diethylene glycol acrylate, phenoxy tetraethyleneglycol tetraacrylate, EO modified phenoxylated phosphoric acrylate, EO modified phthalic acrylate, EO modified phthalic methacrylate, polybutadiene urethane methacrylate, etc., but particularly preferably 4-hydroxyphenyl methacrylate and phenoxyethyl acrylate.

The counter anion of the diazo resin to be used in the present invention is inclusive of anions which form stably a salt with said diazo resin and also make said resin soluble in an organic solvent. These may include organic carboxylic acids such as decanoic acid and benzoic acid, organic phosphoric acids such as phenylphosphoric acid, etc. and sulfonic acids. Typical examples may include aliphatic and aromatic sulfonic acids such as methanesulfonic acid, chloroethanesulfonic acid, dodecanesulfonic acid, benzenesulfonic acid, toluenesulfonic acid, mesitylenesulfonic acid and anthraquinonesulfonic acid, 2-hydroxy-4-methoxybenzophenone-5-sulfonic acid, hydroxysulfonic acid, 4-acetylbenzenesulfonic acid, dimethyl-5-sulfoisophthlate, etc.; hydroxyl containing aromatic compounds such as 2,2',4,4'-tetrahydroxybenzophenone, 1,2,3-trihydroxybenzophenone, 2,2',4-trihydroxybenzophenone, etc.; halogenated Lewis acids such as hexafluorophosphoric acid, tetrafluoroboric acid, etc.; perhalogenic acids such as $ClO_4$, $IO_4$, etc., but these are not limitative of the present invention. Among them, particularly preferred are hexafluorophosphoric acid, 2-hydroxy-4-methoxybenzophenone-5-sulfonic acid.

The molecular weight of the diazo compound according to the present invention ranges from 400 to 10,000, preferably from 800 to 5,000. Preferable ranges for m and n are 1 to 12 and 1 to 10 respectively.

The molecular weight of the compound was measured by GPC (Gel Permeation Chromatography). The conditions for GPC were as follows:

Instrument: Model 635 manufactured by Hitachi Co., Ltd.
Separation Column: Shodex A 802, A803 and A804 (manufactured by Shoadenko Co., Ltd., connected in series.
Temperature: Room temperature
Solvent: tetrahydrofuran
Flow rate: 1.5 ml/min
Calibration Curve: Prepared by using polystyrenes as standard substances.

The diazo compound of the above formula (I) can be synthesized according to the known method, for example, the method of Photographic Science and Engineering vol. 17, p. 33 (1973) as described above.

Synthesis Example of Cocondensed Diazo Resin

Next, synthesis examples of the diazo compound of the formula (I) are shown below (Cocondensed diazo resin 1)

An amount 4.43 g (0.025 mole) of 4-hydroxyphenyl-methacrylamide and 22.0 g (0.075 mole) of 4-diazodiphenylamine sulfate were dissolved in 90 g of conc. sulfuric acid under ice-cooling. To the solution was added 2.7 g (0.09 mole) of p-formaldehyde so that the temperature did not exceed 10° C. Then, stirring was continued under ice-cooling for 2 hours.

The reaction mixture was poured into one liter of ethanol under ice-cooling and the precipitates formed were filtered. The precipitates were thoroughly washed with ethanol, then dissolved in 200 ml of pure water and to the resultant solution was added an aqueous solution of 10.5 g of zinc chloride. The precipitates formed were filtered, washed with ethanol and then dissolved in 300 ml of pure water. To the solution was added an aqueous solution having 13.7 g of ammonium hexafluorophosphate dissolved therein. The precipitates formed were separated by filtration, washed with water and then dried overnight at 30° C. to obtain a cocondensed diazo resin 1. The molecular weight of the cocondensed diazo resin 1 was measured by GPC to be about 2,200 (m=3-6, n=1-2, molar ratio 3:1) in terms of weight average molecular weight.

(Cocondensed diazo resins 2 to 6)

According to the same method, as shown in Table 1, by varying Ar, B and counterion ($X^-$), cocondensed resins-2 to 6 were obtained.

TABLE 1
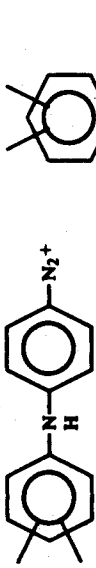

Polymeric Binder Having Polymerizable Unsaturated Bond In The Molecule

As the polymeric binder according to the present invention, there may be included benzyl (meth)acrylate/(meth)acrylic acid/optionally other addition polymerizable vinyl monomer copolymers as described in Japanese Patent Publication No. 44615/1984; methacrylic acid/methyl methacrylate or ester/alkyl methacrylate copolymer as described in Japanese Patent Publication No. 34327/1979; otherwise (meth)acrylic acid copolymers as described in Japanese Patent Publications Nos. 12577/1983, 25957/1979, Japanese Unexamined Patent Publication No. 92723/1979; allyl (meth)acrylate/(meth)acrylic acid/optionally other addition polymerizable vinyl monomer copolymers as described in Japanese Unexamined Patent Publication No. 53836/1984; acidic vinyl copolymers with an acid value of 50 to 200 having —COOH, —PO$_3$H$_2$, —SO$_3$H, —SO$_3$NH$_2$, —SO$_3$NHCO— group in the polymers having pentaerythritol triacrylate added by half esterification to maleic anhydride copolymder as described in Japanese Unexamined Patent Publication No. 71048/1984; and so on.

Synthesis Example of Polymeric Binder

Synthesis examples of polymeric binders are shown below.

Synthesis Example 1

Synthesis Of Poly(Allyl Methacrylate/Methacrylic Acid) Copolymer

To a solution of 113.4 g of allyl methacrylate and 8.6 g of methacrylic acid dissolved in 2 liters of 1,2-dichloroethane was added 1.8 g of 2,2'-azobis(2,4-dimethylvaleronitrile) as the polymerization initiator and the mixture was refluxed for 5 hours. After refluxing, the reaction mixture was concentrated under reduced pressure and the concentrate was poured into hexane, followed by drying of the precipitates obtained under vacuum to obtain a binder 1.

Synthesis Example 2

Synthesis Of Poly(Allyl Methacrylate/P-hydroxyphenylmethacrylamide/-Methyl Acrylate/Acrylonitrile/Methacrylic Acid) Copolymer To a solution of 59.2 g of allyl methacrylate, 17.7 g of p-hydroxyphenylmethacrylamide, 15.0 g of methyl acrylate, 10.6 g of acrylonitrile and 6.9 g of methacrylic acid dissolved in a solvent mixture of 400 ml of acetone and 400 ml of methanol, 1.6 g of azobisisobutyronitrile was added as the polymerization initiator and the reaction was carried out by refluxing for 6 hours. The reaction mixture was concentrated to 400 ml, and after concentration, the precipitates obtained by pouring into 2 liters of water were vacuum dried to obtain a binder 2.

The above polymeric binder according to the present invention should be preferably contained in an amount of 99 to 70%, particularly 97 to 50% in the total composition.

Alkali Soluble Polymer

The photosensitive diazo resin as described above is used together with an alkali soluble (or swellable) polymer as the binder.

As the alkali soluble polymer, copolymers having monomers as shown below in (1) to (12) as structural units and molecular weights ordinarily of 20,000 to 200,000 may be employed.

(1) acrylamides, methacrylamides, acrylates and methacrylates having aromatic hydroxyl group such as N-(4-hydroxyphenyl)alkylamide or N-(4-hydroxyphenyl)-methacrylamide, o-, m-, p-hydroxystyrene, o-, m-, p-hydroxyphenyl-acrylate or methacrylate;

(2) acrylates and methacrylates having aliphatic hydroxyl group such as 2-hydroxyethyl acrylate or 2-hydroxyethyl methacrylate;

(3) α,β-unsaturated carboxylic acids such as acrylic acid, methacrylic acid, maleic anhydride and the like;

(4) (substituted) alkyl acrylates such as methyl acrylate, ethyl acrylate, propyl acrylate, butyl acrylate, amyl acrylate, hexyl acrylate, octyl acrylate, 2-chloroethyl acrylate, glycidyl acrylate, N-dimethylaminoethyl acrylate and the like;

(5) (substituted) alkyl methacrylates such as methyl methacrylate, ethyl methacrylate, propyl methacrylate, butyl methacrylate, amyl methacrylate, cyclohexyl methacrylate, 4-hydroxybutyl methacrylate, glycidyl methacrylate, N-dimethylaminoethyl methacrylate and the like;

(6) acrylamides or methacrylamides such as acrylamide, methacrylamide, N-methylolacrylamide, N-methyolmethacrylamide, N-ethylacrylamide, N-hexylmethacrylamide, N-cyclohexylacrylamide, N-hydroxyethylacrylamide, N-phenylacrylamide, N-nitrophenylacrylamide, N-ethyl-N-phenylacrylamide, N-ethyl-N-phenylacrylamide and the like;

(7) vinyl ethers such as ethyl vinyl ether, 2-chloroethyl vinyl ether, hydroxyethyl vinyl ether, propyl vinyl ether, butyl vinyl ether, octyl vinyl ether, phenyl vinyl ether and the like;

(8) vinyl esters such as vinyl acetate, vinyl chloroacetate, vinyl butyrate, vinyl benzoate and the like;

(9) styrenes such as styrene, α-methylstyrene, methylstyrene, chloromethylstyrene and the like;

(10) vinyl ketones such as methyl vinyl ketone, ethyl vinyl ketone, propyl vinyl ketone, phenyl vinyl ketone and the like;

(11) olefins such as ethylene, propylene, isobutylene, butadiene, isoprene and the like;

(12) N-vinylpyrrolidone, N-vinylcarbazole, 4-vinylpyridine, acrylonitrile, methacrylonitrile, etc.

Further, a monomer copolymerizable with the above monomers can be also copolymerized therewith. Also, the copolymers obtained by copolymerization of the above monomers modified with, for example, glycidyl methacrylate, glycidyl acrylate, etc., are included, but these are not limitative of the present invention.

More specifically, copoolymers having hydroxyl group containing the monomers as mentioned above in (1), (2) are preferred, more preferably copolymers having aromatic hyroxyl group.

In the above copolymers, it is particularly preferable to contain α,β-unsaturated carboxylic acid, and the preferable acid value of the copolymer may be 10 to 100.

The preferable molecular weight of the above copolymer may be 40,000 to 150,000.

In the above copolymer, if necessary, polyvinyl butyral resin, polyurethane resin, polyamide resin, epoxy resin, novolac resin, natural resin may be also added.

This kind of alkali soluble polymer is contained in the solid components of the photosensitive composition generally in an amount of 40 to 99% by weight, preferably 50 to 95% by weight.

On the other hand, particularly preferable as the alkali soluble polymer as the binder is a polymer having methyl acrylate as the structural units. In this case, further preferable are copolymers as shown below.

More specifically, they are copolymers containing in the molecular structure:

(a) 1 to 50 mole % of a structural unit having an alcoholic hydroxyl group and/or a structural unit having a phenolic hydroxyl group;

(b) 5 to 40 mole % of a structural unit represented by the following formula I':

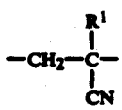

wherein $R^1$ represents hydrogen atom or an alkyl group;

(c) 5 to 40 mole % of a unit formed of methyl acrylate;

(d) 25 to 60 mole % of a structural unit represented by the following formula II:

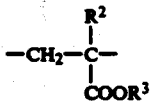

wherein $R^2$ represents hydrogen atom, methyl group or ethyl group, and $R^3$ represents an alkyl group having 2 to 12 carbon atoms or an aryl group substituted with an alkyl group having 2 to 12 carbon atoms; and (e) 2 to 30 mole % of a structural unit having carboxyl group, and having the weight average molecular weight of 50,000 to 200,000.

Specific examples of the monomers forming the above structural unit having alcoholic hydroxyl group may include (meth)acrylates such as the compounds represented by the following formula III as described in Japanese Patent Publication No. 7364/1977 and acrylamides.

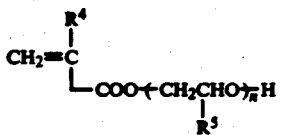

In the above formula, $R^4$ represents hydrogen atom or methyl group, $R^5$ represents hydrogen atom, methyl group, ethyl group or chloromethyl group and n represents an integer of 1 to 10.

Examples of (meth)acrylates may include 2-hydroxyethyl (meth)acrylate, 2-hydroxpropyl (meth)acrylate, 2-hydroxypentyl (meth)acrylate and the like, and examples of acrylamides may include N-methylol (meth)acrylamide, N-hydroxyethyl (meth)acrylamide and the like. Preferably, 2-hydroxyethyl (meth)acrylate may be employed.

The monomer forming the structural unit having phenolic hydroxyl group may be exemplified by monomers of (meth)acrylamides such as N-(4-hydroxyphenyl)-(meth)acrylamide, N-(2-hydroxyphenyl)-(meth)acrylamide, N-(4-hydroxynaphthyl)-(meth)acrylamide and the like; o-, m- or p-hydroxyphenyl (meth)acrylate monomers; o-, m- or p-hydroxystyrene monomers; etc. Preferably, o-, m- or p-hydroxyphenyl (meth)acrylate monomers, N-(4-hydroxyphenyl)-(meth)acrylamide monomers, more preferably N-(4-hydroxyphenyl)-(meth)acrylamide monomer may be employed.

The above structural unit having alcoholic hydroxyl group and/or the structure unit having phenolic hyroxyl group may be contained in a range of 1 to 50 mole %, preferably 5 to 30 mole % in the polymeric compound.

As the monomer having cyano group in the side chain forming the structural unit represented by the above formula I, there may be included acrylonitrile, methacrylonitrile, 2-pentenenitrile, 2-methyl-3-butenenitrile, 2-cyanoethyl acrylate, o-, m-, p-cyanostyrene and the like. Acrylonitrile, methcarylonitrile are preferred. The ratio of said structural unit having cyano group in the side chain in the molecules of the polymeric compound may be selected from the range of 5 to 40 mole %, preferably 15 to 35 mole %.

The ratio of said units formed of methyl acrylate may be selected from the range of 5 to 40 mole %, preferably 10 to 30 mole %, in the polymeric compound.

As the monomer having carboxylate group in the side chain forming the structural unit represented by the above formula II, there may be included ethyl acrylate, ethyl methacrylate, propyl acrylate, butyl acrylate, amyl acrylate, amyl methacrylate, hexyl acrylate, octyl acrylate, 2-chloroethyl acrylate, 2-hydroxyethyl acrylate, glycidyl acrylate and the like. The ratio of the unit formed of said monomer may be slected from the range of 25 to 60 mole %, preferably 35 to 60 mole %, in the polymeric compound.

As the monomer forming the structural unit having carboxyl group, there may be included methacrylic acid, acrylic acid, maleic anhydride, maleic acid and the like. The ratio of said monomer is selected from the range of 2 to 30 mole %, preferably 5 to 15 mole %, in the polymeric compound.

The above respective structural units are not limited to the units formed of the monomers set forth above as specific examples.

As the method for synthesizing the alkali soluble polymer as the binder in the photosensitive composition, it can be easily synthesized by the radical polymerization method generally known in the art, for example according to the solution polymerization method by use of an initiator (0.1 to 4.0 mole %) such as azobisisobutyronitrile, benzoyl peroxide, etc.

In the following, synthesis examples of alkali soluble polymers are shown.

Synthesis Of Alkali Soluble Polymer 1

An amount 10.0 g of N-(4-hydroxyphenyl)methacrylamide, 25 g of acrylonitrile, 60 g of ethyl acrylate, 5 g of methacrylic acid and 1.642 g of of azobisisobutyronitrile were dissolved in 112 ml of a 1:1 mixed solution of acetone and methanol, replaced with nitrogen and then heated at 60° C. for 8 hours.

After completion of the reaction, the reaction mixture was poured into 5 liters of water under stirring, and the white precipitates formed were filtered and dried to obtain 90 g of an alkali soluble polymer 1.

The molecular weight of the alkali soluble polymer 1 was measured by gel permeation chromatography (hereinafter abbreviated as GPC) to be 85,000 as weight average molecular weight.

Synthesis Of Alkali Soluble Polymer 2

A mixture of 50.0 g of 2-hydroxyethyl methacrylate, 20 g of acrylonitrile, 25 g of methyl methacrylate, 5 g of methacrylic acid and 1.2 g of benzoyl peroxide was added dropwise over 2 hours into 300 g of ethylene glycol monomethyl ether heated to 100° C. After completion of the dropwise addition, 300 g of ethylene glycol monomethyl ether and 0.3 g of benzoyl peroxide were added, and the reaction was carried out as such for 4 hours. After completion of the reaction, the mixture was diluted with methanol and added into 5 liters of water under stirring. The white precipitates formed were filtered and dried to obtain 90 g of a lipophilic polymeric compound 2.

The molecular weight of the alkali soluble polymer 2 was measured by GPC to be 65,000 as weight average molecular weight.

Synthesis Of Alkali Soluble Polymer 3

A mixture of 45 g of 2-hydroxyethyl methacrylate, 10 g of acrylonitrile, 35 g of ethyl methacrylate, 10 g of methacrylic acid and 1.2 g of benzoyl peroxide was added dropwise into ethylene glycol monomethyl ether similarly as in the case of synthesis of the alkali soluble polymer 2 to obtain 90 g of an alkali soluble polymer 3.

The molecular weight of the alkali soluble polymer 3 was measured by GPC to be 62,000 as weight average molecular weight.

Photopolymerization Initiator

As the photopolymerization initiator of the present invention, there may be used ones known to the art, however, trihalomethyloxadiazole compounds or S-triazine trihalomethyl compounds are particularly preferable. As the photopolymerization initiator, the followings may be mentioned:

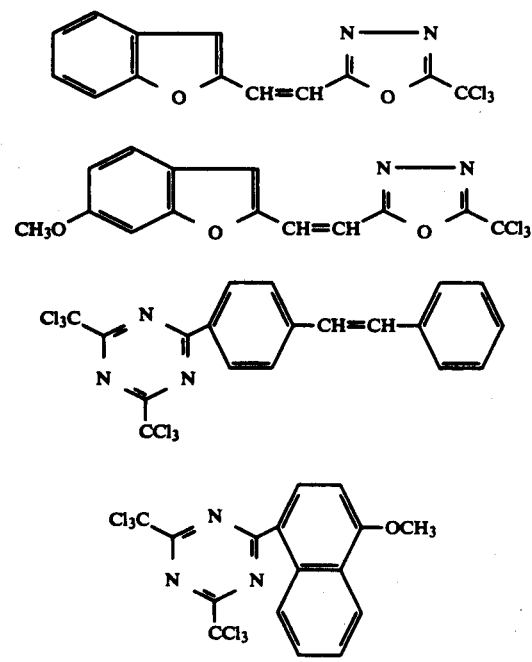

The photopolymerization initiator should be preferably contained in an amount of 0.1 to 20%, particularly 0.5 to 10% in the total composition.

Photopolymerizable Monomer

As the photopolymerizable monomer in the present invention, monomers or oligomers with molecular weight of 10,000 or less having a boiling point of 100° C. or higher at normal pressure and at least one addition polymerizable unsaturated group in one molecule are preferred. Specific examples of such monomers or oligomers may include monofunctional acrylates or methacrylates such as polyethylene glycol mono(meth)acrylate, polypropylene glycol mono(meth)acrylate, phenoxyethyl (meth)acrylate, etc.; those having ethylene oxide or propylene oxide added to polyhydric alcohols such as polyethylene glycol di(meth)acrylate, polypropylene di(meth)acrylate, trimethylolethane tri(meth)acrylate, neopentyl glycol di(meth)acrylate, pentaerythritol tri(meth)acrylate, pentaerytritol tetra(meth)acrylate, dipentaerythritol hexa(meth)acrylate, hexanediol di(meth)acrylate, tri(acryloyloxyethyl) isocyanurate, glycerine or trimethylolethane, followed by (meth)acrylation; urethane acrylates as described in Japanese Patent Publications Nos. 41708/1973, 6034/1975, Japanese Unexamined Patent Publication No. 37193/1976; polyester acrylates as described in Japanese Unexamined Patent Publication No. 64183/1973, Japanese Patent Publications Nos. 43191/1974, 30490/1977; polyfunctional acrylates or methacrylates such as epoxy acrylates obtained by reacting epoxy resins with (meth)acrylic acid, etc. More particularly, it is also possible to use polymerizable compounds described as photocurable monomers and oligomers in Journal of Adhesive Society of Japan, Vol. 20, No. 7, p. 300 to 308.

The amount of the above photopolymerizable monomer added may be 5 to 50% by weight, preferably 10 to 40% by weight, particularly 10 to 20% by weight, in the total composition.

Together with the photopolymerization initiator, there may be also employed a polymerization inhibition, such as hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), etc.

In the photosensitive composition to be used in the present invention, if necessary, dyes, pigments, coatability enhancers, plasticizers, etc. can be added in addition to the above mentioned components.

The above mentioned dyes may include triphenylmethane type, diphenylmethane type, oxaidine type, xanthene type, iminonaphthoquinone type, azomethine type or anthraquinone type dyes as represented by Victoria Pure Blue BOH (manufactured by Hodogaya Kagaku), Oil Blue #603 (manufactured by Orient Kagaku Kogyo), Patent Pure Blue (manufactured by Sumitomo Mikuni Kagaku), Crystal Violet, Brilliant Green, Ethyl Violet, Methyl Green, Erythrocin B, Basic Fucsine, Malachite Green, Oil Red, m-Cresol Purple, Rhodamine B, Auramine, 4-p-diethylaminophenyliminonaphthoquinone, cyano-p-diethylaminophenyl acetanilide, etc.

The above dye may be generally used in the photosensitive composition preferably in an amount of about 0.5 to about 10% by weight, more preferably about 1 to 5% by weight.

As the coatability enhancer, there may be included alkyl ethers (e.g. ethyl cellulose, methyl cellulose), fluorine type surfactants, nonionic surfactants [e.g. Pluronic L-64 (manufactured by Asahi Denka)]; as the plasticizers for imparting flexibility, abrasion resistance of coating, for example, butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, oligomers of acrylic acid or methacrylic acid; as the lipid sensitive agent for improving lipid sensitivity of the image portion, for example, half-esterified products of styrene-maleic anhydride copolymers with alcohol as described in Japanese Unexamined Patent Publication No. 527/1980; as stabilizers, for example, polyacrylic acid, tartaric acid, phosphoric acid, phosphorous acid, organic acids (acrylic acid, methacrylic acid, citric acid, oxalic acid, benzenesulfonic acid, naphthalenesulfonic acid, 4-methoxy-2-hydroxybenzopheone-5-sulfonic acid, etc.), etc. The amount of these additives added may differ depending on the object to be used, but may be generally 0.01 to 30% by weight based on the total solids.

By coating the photosensitive composition as described above on the surface of a support, a photosensitive lithographic printing plate is obtained.

As the coating solvent, there may be employed cellosolves such as methyl cellosolve, methyl cellosolve acetate, ethyl cellosolve, ethylcellosolve acetate, etc., dimethylformamide, dimethyl sulfoxide, dioxane, acetone, cyclohexanone, trichlotoethylene, methyl ethyl ketone, etc. These solvents may be used either singly or as a mixture of two or more kinds.

As the coating method, those known in the art may be available, including rotatory coating, wire bar coating, dip coating, air knife coating, roll coating, blade coating and curtain coating. The amount coated may be preferably 0.2 to 10 $g/m^2$ as the solid components.

As the support of the photosensitive lithographic printing plate of the present invention, it is preferable to use an aluminum plate. One subjected to sand blasting treatment by performing electrolytic surface roughening in nitric acid or an electrolyte composed mainly of nitric acid or in hydrochloric acid or an electrolyte composed mainly of hydrochloric acid, preferably, further to anodic oxidation treatment and, if necessary, surface treatment such as sealing treatment, etc. may be employed.

Electrolytic surface roughening should preferably be conducted by dipping an aluminum plate in a bath containing 0.1 to 0.5 mol/liter, preferably 0.2 to 0.4 mol/liter of nitric acid or hydrochloric acid and effecting electrolytic etching at a temperature of 20° to 50° C., preferably 25° to 40° C., at a current density of 20 to 200 A/dm2, for about 10 seconds to 3 minutes. After such sand blasting treatment, if necessary, desmatting treatment is carried out with an aqueous solution of an alkali or an acid, followed by neutralization and washing with water.

For the anodic oxidation treatment, a solution containing one or two or more of sulfuric acid, chromic acid, oxalic acid, phosphoric acid, malonic acid, etc. is used as the electrolyte, and electrolysis is conducted with the aluminum plate as the anode. The amount of the anode oxide film formed may be suitably 1 to 50 $mg/dm^2$, preferably 10 to 40 $mg/dm^2$. Here, the anode oxide film amount can be determined by, for example, dipping the aluminum plate in a phosphoric chromic acid solution (formed by dissolving 35 ml of 85% aqueous phosphoric acid and 20 g of chromic (VI) oxide in one liter of water) to dissolve the oxide film and measuring the weight change before and after dissolution of the film of the plate.

As the sealing treatment, there are the boiling water treatment, the water vapor treatment, the sodium silicate treatment, the aqueous saline bichromic acid treatment, etc. Otherwise, it is also possible to apply subbing treatment with an aqueous solution of a water-soluble polymeric compound or a metal salt such as zirconium fluoride, etc. on the aluminum support.

The photosensitive lithographic printing plate thus obtained can be used according to the method known in the art. Typically, with a nega-type film contacted on the photosensitive printing plate, exposure is effected by means of a ultra-high pressure mercury lamp, a metal halide lamp, etc., followed by developing with various developers known in the art, to give a printing plate. The lithographic printing plate thus prepared can be used for sheet or off-set printer.

More specifically, exposure is effected through a transparent original image having a line image, a dot image, etc., and subsequently developing is effected with an aqueous developer, whereby a relief image negative relative to the original image is obtained. As the suitable light source for exposure, carbon arc lamp, mercury lamp, xenon lamp, metal halide lamp, strobo, etc. may be employed.

The developer to be used for developing processing of the photosensitive lithographic treatment of the present invention may be any one of those known in the art, but, for example, it is preferable to use an organic solvent as represented by benzyl alcohol or ethylene glycol monophenyl ether, an alkali agent such as silicate of alkali metal or organic amine compounds, and those containing water as the main component, or anionic surfactant as represented by the above alkali agent, higher alcohol sulfates or alkyl arylsulfonates without containing organic solvent, and those containing organic carboxylic acid as the main component.

The photosensitive lithographic printing plate of the present invention, after imagewise exposure, can be contacted with the developer as described above or rubbed, whereby the photosensitive composition at the nonexposed portion will be completely removed at about 10° C. to 40° C. after 10 to 60 seconds without affecting deleteriously the exposed portion of the photosensitive layer.

EXAMPLE

The present invention is described in more detail by referring to the following Examples, but the present invention is not limited to these Examples at all.

EXAMPLE 1

An aluminum plate was degreased with 3% aqueous sodium hydroxide, subjected to electrolytic etching in 2% aqueous hydrochloric acid bath at 25° C. under the current density condition of 30 $A/dm^2$ 25 sec. and, after washing with water, to anodic oxidation treatment in 30% by weight sulfuric acid bath under the conditions of 30° C., 6 $A/dm^2$, for 30 sec.. Subsequently, sealing treatment was effected with 1% aqueous sodium metasilicate at 85° C. for 30 seconds, followed by washing with water and drying, to give an aluminum plate for lithographic printing plate.

The aluminum plate was coated with a photosensitive solution A having a composition shown below to a film weight after drying of 1.7 g/m2 to obtain a photosensitive lithographic printing plate sample A.

Photosensitive solution A:

| | |
|---|---|
| Cocondensed diazo resin 1 (shown in the above synthesis example) | 1 g |
| Polymeric binder 1 shown in synthesis example 1 | 10 g |
| Photopolymerization initiator (1) described above | 0.2 g |
| Jurimer AC-10L (produced by Nippon Junyaku) | 0.6 g |
| Victoria Pure Blue BOH | 0.2 g |
| Ethylene glycol monomethyl ether | 190 g |

EXAMPLES 2 AND 3

Example 1 was repeated except for using copolymerized diazo resins 4 and 6 shown in Table 1 in place of the cocondensed diazo resin 1 to obtain photosensitive lithographic printing plate samples B and C, respectively.

COMPARATIVE EXAMPLE 1

A photosensitive lithographic plate sample D was obtained in the same manner as in Example 1 except that a diazo compound of the above formula (I)" wherein Ar is

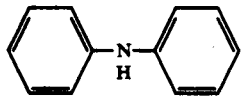

B is not contained and the counter anion X is $PF_6-$ was used in place of the cocondensed diazo resin 1.

EXAMPLE 4

An aluminum plate for lithographic printing plate was obtained in the same manner as in Example 1.

The aluminum plate was coated with a photosensitive solution B having a composition as shown below to a film weight after drying of 17 g/m² to obtain a photosensitive lithographic printing plate sample E.

Photosensitive solution B:

| | |
|---|---|
| Cocondensed diazo resin 1 (shown in the above synthesis example) | 1 g |
| Polymeric binder 1 shown in synthesis example 1 | 10 g |
| Photopolymerization initiator (1) described above | 0.2 g |
| Photopolymerizable monomer | 1.8 g |
| Jurimer AC-10L (produced by Nippon Junyaku) | 0.6 g |
| Victoria Pure Blue BOH | 0.2 g |
| Ethylene glycol monomethyl ether | 190 g |

EXAMPLES 5 AND 6

Example 4 was repeated except for using copolymerized diazo resins 4 and 6 shown in Table 1 in place of the cocondensed diazo resin 1 to obtain photosensitive lithographic printing plate samples F and G, respectively.

COMPARATIVE EXAMPLE 2

A photosensitive lithographic plate sample H was obtained in the same manner as in Example 4 except that a diazo compound of the above formula (I)" wherein Ar is

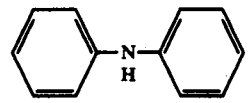

B is not contained and the counter anion X is $PF_6-$ was used in place of the cocondensed diazo resin 1.

On the respective samples A–H obtained as described above, a negative transparent original and a step wedge (a density difference being increased by 0.15) were placed and exposure was effected by a 2 kW metal halide lamp from a distance of 60 cm for 30 seconds, followed by dipping in "SDN-21 developer" (manufactured by Konica, diluted to 1:3) at 25° C. for 40 seconds and then lightly rubbing with absorbent cotton to effect developing.

The solid step number of step wedge after developing was as shown in Table 2.

TABLE 2

| Sample | Solid step number Evacuation contact time (second) 8 | 30 | Defect of image portion | |
|---|---|---|---|---|
| A | 4.0 | 4.5 | Δ | the invention |
| B | 3.5 | 4.5 | Δ | the invention |
| C | 4.5 | 5.0 | Δ | the invention |
| D | 2.5 | 4.0 | X | comparative |
| E | 4.5 | 5.0 | O | the invention |
| F | 4.0 | 5.0 | O | the invention |
| G | 5.5 | 5.5 | O | the invention |
| H | 5.5 | 5.5 | X | comparative |

From the results in the above Table 2, the samples A, B, C, E, F and G according to the present invention are higher in solid step number, and smaller in difference between the case of shorter evacuation contact time and the case of longer evacuation contact time, from which it can be understood that the influence of oxygen is smaller.

On the other hand, the comparative sample D is lower in solid step number and larger in difference between the case of shorter evacuation contact time and the case of longer evacuation contact time, from which it can be understood that the influence of oxygen is larger. Further, in case of the comparative sample H, difference between the shorter evacuation contact time and the longer evacuation contact time is larger, from which it can also be understood that the influence of oxygen is larger.

Further, after each sample was dipped in a ultraplate cleaner for one hour and washed with water, followed by rubbing lightly with sponge, the manner in which the image portion on the plate was invaded was examined to obtain the results which are also shown in Table 2. In the same Table, the mark o indicates that there is substantially no change before dipping, the mark Δ indicates that there is a small change and the mark x indicates that image portions are lacked at places.

According to the present invention, there can be obtained a composition suitable for photosensitive lithographic printing plate which is excellent in sensitivity and chemical resistance, and yet is influenced little by oxygen.

We claim:

1. A photosensitive composition comprising in admixture a photosensitive diazo compound, having a structure represented by the Formula I:

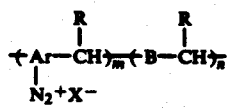

wherein $ArN_2X$ is an aromatic having diazonium salt, B is an aromatic having a polymerizable unsaturated bond and R is a hydrogen atom, methyl group or phenyl group, $m=1\sim20$, and $n=1\sim20$, a polymeric binder and a photopolymerization initiator.

2. The photosensitive composition according to claim 1, wherein $m=1\sim12$ and $n=1\sim10$.

3. The photosensitive composition according to claim 1, wherein said composition further contains a photopolymerizable monomer.

4. The photosensitive composition according to claim 1, wherein said polymeric binder has a polymerizable unsaturated bond in the molecule.

5. The photosensitive composition according to claim 1, wherein said polymeric binder is an alkali soluble polymer.

6. The photosensitive composition according to claim 1, wherein said diazo compound is contained in an amount of 1 to 70% by weight to the total composition.

7. The photosensitive composition according to claim 1, wherein said polymeric binder is contained in an amount of 99 to 70% by weight to the total composition.

8. The photosensitive composition according to claim 1, wherein said photopolymerization initiator is is contained in an amount of 0.1 to 20% by weight to the total composition.

9. The photosensitive composition according to claim 3, wherein said photopolymerizable monomer is contained in an amount of 5 to 50% by weight to the total composition.

* * * * *